United States Patent [19]
Schultz et al.

[11] Patent Number: 5,164,659
[45] Date of Patent: Nov. 17, 1992

[54] SWITCHING CIRCUIT

[76] Inventors: Warren Schultz, 1541 E. Driftwood Dr., Tempe, Ariz. 85283; Stephen Su, 1927 E. Hampton, Mesa, Ariz. 85204

[21] Appl. No.: 751,853
[22] Filed: Aug. 29, 1991
[51] Int. Cl.5 .................. H02M 3/335; G05F 1/565
[52] U.S. Cl. ................................. 323/351; 323/284; 340/652; 361/18
[58] Field of Search ............. 323/282, 283, 284, 285, 323/351; 340/652, 660-664; 361/18, 86-88, 91

[56] References Cited
U.S. PATENT DOCUMENTS

| | | | |
|---|---|---|---|
| 4,599,555 | 7/1986 | Damiano et al. | 323/351 |
| 4,698,582 | 10/1987 | Braun et al. | 323/285 |
| 4,864,214 | 9/1989 | Billings et al. | 323/284 |
| 4,929,883 | 5/1990 | Chieli | 323/351 |
| 4,962,350 | 10/1990 | Fukuda | 323/284 |
| 4,964,010 | 10/1990 | Miyasaka et al. | 361/18 |

Primary Examiner—Peter S. Wong

[57] ABSTRACT

A low impedance load is switched between a power supply source and ground through a series connected power MOSFET the conduction of which is controlled by a switching circuit. The switching circuit includes a linear loop that regulates the switch voltage to a minimum value to produce current flow through the load and the MOSFET. In addition, the switching circuit includes a current supply placed in parallel to the MOSFET which is set to supply a minimum predetermined current that is representative of the value of current flow through the load under an open load condition. If the load current falls below this set current value an open load status flag is provided by the switching circuit as the loop is no longer in regulation.

16 Claims, 2 Drawing Sheets

SWITCHING CIRCUIT

BACKGROUND OF THE INVENTION

The present invention relates to switching circuits and, more particularly, to switching circuits which sense the status of a load coupled thereto and which provide a flag indicating an open load status.

The prior art is replete with switching circuits in which a load is connected in series with the main electrodes of a transistor between positive and ground power supply rails. By controlling the conduction state of the transistor, current is supplied to the load. One example of such a switching circuit is referred to as a high side driver circuit and is commonly used to control relays in the automotive environment. A typical application of a high side driver circuit is to control the operation fuel injectors of an automotive engine where the load is the low impedance relay coil of the injector. Therefore, by controlling the current through the load, or relay coil, the fuel injector is opened and closed synchronously with the operation of the engine of the automobile as is understood. This is just one example of a use of such a switching circuit; there being myriad of applications for current switching.

In many applications, such as aforedescribed, a power MOSFET switching device has its main electrodes (drain and source) connected in the series conduction path which includes the load, a power supply source and a load current sense resistor. In response to an input signal applied to the circuit, the MOSFET is switched or turned on to complete the series conduction path to permit current flow through the load, the MOSFET and the sense resistor. A 10–30 ampere load current may flow through the series connected elements during normal operating conditions. The sense resistor is used to develop a voltage thereacross the magnitude of which is utilized to limit the maximum value of the load current as is known. In order to maintain maximum load current and to reduce power dissipation, the resistance of the sense resistor is kept very low, i.e., typically less than a half ohm. Thus, in normal operation only a volt or less is developed across the sense resistor at the desired maximum load current.

The foregoing presents a problem if it is desired to be able to detect an open load condition wherein the load current under otherwise normal operating conditions becomes less than several miliamperes. Under an open load condition the voltage developed across the sense resistor may be less than a half milivolt. This small value of voltage may be difficult to accurately detect and to provide the indication of the open load condition.

Thus a need exists to overcome the aforedescribed problems of the prior art.

SUMMARY OF THE INVENTION

In accordance with the above there is provided a switching circuit for series coupling a load to a power supply source including a device that is controlled by the switching circuit that comprises a controlled current source connected in parallel to the device the current supplied therefrom being set to a predetermined value that is indicative of an open load condition, and a regulating loop that is responsive to an input signal applied to the circuit for both rendering the device operative to provide a series conduction path through the load and the device and for linearly regulating the switching voltage between the device and the load to a predetermined value when the load current exceeds the value of the current supplied from the current source.

DETAILED DESCRIPTION OF THE PREFERRED EMBODIMENTS

Figure 1:
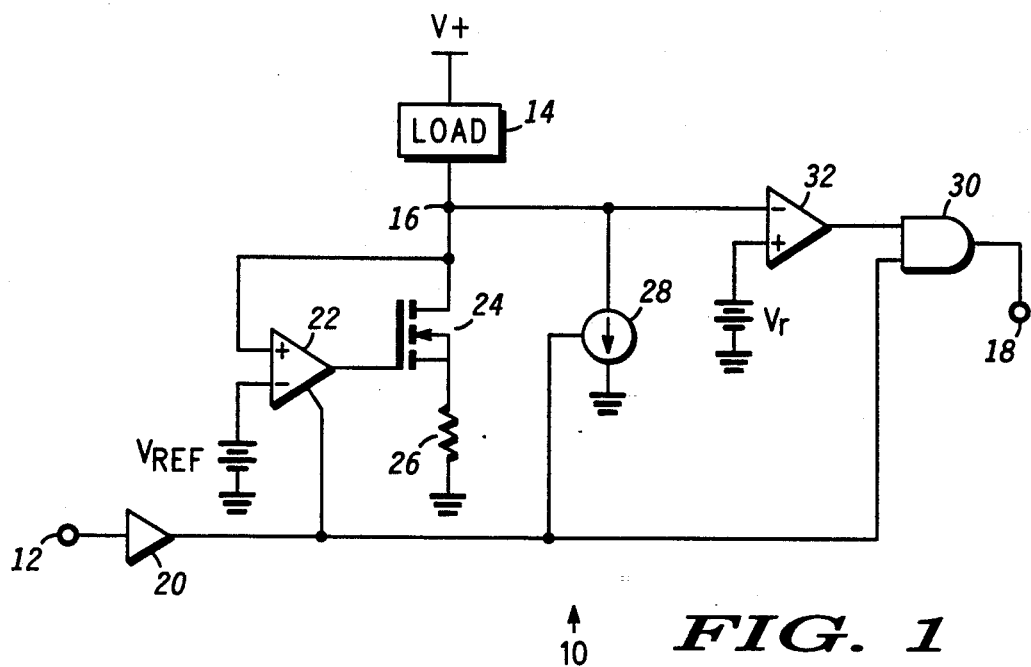
FIG. 1 is a schematic of a switching circuit in accordance with the teachings of the embodiment of the present invention.

Turning to FIG. 1, switching circuit 10 illustrates the general concepts of the embodiments of the present invention. Switching circuit 10 is responsive to a control signal applied at input 12 thereof for connecting load means 14 between V+ and ground as power MOSFET 24 is switched to a conducting state as is generally known. Typically, load means 14 is external to circuit 10, the latter of which is suited to be manufactured in integrated circuit form, and is coupled to the drain of MOSFET 24 at terminal 16. The source of MOSFET 24 is coupled to one end of load current sense resistor 26 which has the other end returned to ground reference. The gate of MOSFET 24 is coupled to the output of comparator operational amplifier 22. Input 12 is coupled via buffer amplifier 20 to an enable input of amplifier 22 as well as to a control input of current source 28 and a first input of And gate 30. The inverting input of comparator 22 is supplied a reference potential Vref while the non-inverting input is returned to the drain of MOSFET 24. Current source 28 is coupled between the drain of MOSFET 24 and ground in parallel with MOSFET 24. Finally, the drain of MOSFET 24 is also coupled to the inverting input of comparator 32 the non-inverting input of which is coupled to a second reference potential Vr while the output of comparator 32 is coupled to a second input of And gate 30 the output of which is coupled to open load sense output 18. The feature of the invention is that comparator 22 provides a linear loop that is used to regulate the minimum switch voltage which in combination with parallel connected current source 28 sets the minimum value of load current that indicates a open load status while providing an output signal indicative thereof; as will be more fully explained.

In normal operation, a logic high input signal applied to input 12 is buffered through amplifier 20 to both enable comparator 22 and current source 28. As load 14 is typically a low impedance means substantially all of the power supply voltage appears at node 16. Hence, the non-inverting input of comparator 22 is at a greater potential than Vref and the output of the same is therefore high to switch MOSFET 24 into a conducting state. It is to be understood that in the present application that the speed at which MOSFET 24 is switched from a non-conducting state to a conducting state is not critical in that the speed of comparator 22 is sufficient for the operation of the circuit. At normal load conditions the load current flow through transistor 24 is such that the sum of the drain to source voltage plus the voltage across resistor 26 exceeds $V_{REF}$ and switch 10 operates as a conventional switching circuit. However, under light load conditions, as MOSFET 24 is rendered conductive, comparator 22 will linearly regulate the voltage at node 16 (the drain of MOSFET 24) to substantially the value of Vref. If Vref is a low potential, for example, about 250 mV, then maximum voltage is applied across load means 14 and maximum current flows therethrough as well as through series connected MOSFET 24 and sense resistor 26. In addition, Vr is set at a value lower than the regulated drain voltage of transistor 24 so that in normal operation the output of comparator 32 is low. Thus, output 18 is at a logic zero indicative of normal operation. In a typical application the load current is between 10 to 30 amperes. Further, in the on condition or normal operation, current is also sourced through current supply 28 which is in parallel to the current flowing through sense resistor 26 (current supply 28 may be realized by a transistor having the main electrodes coupled in series with a resistor between node 16 and ground and its control electrode coupled to the output of buffer amplifier 20). The value of the current set through current supply 28 is determined by the value at which an open load condition is to be sensed and recognized. For instance, if it is predetermined that an open load condition exists if the current flow through load 14 is less than 10 milliamperes, then current supply 28 will have its current value set to 10 milliamperes during operation of circuit 10.

If load 14 should become open circuited for any reason the current flowing therethrough will decrease. Hence, the drain-source current of transistor 24 will also decrease, however, comparator 22 will try to maintain the voltage at the regulated value. Once, the value of load current decreases below the value set for the current through current supply 28, comparator 22 can no longer regulate the voltage at node 16 as current supply 28 becomes saturated which forces the voltage at node 16 to become less than Vr. This will cause the output of comparator 32 to go high. Thus, the output of And gate 30 is forced high as both inputs are now at logic ones and the open load condition is sensed at output 18.

An advantage of the present switching circuit including the linear regulating loop over prior art switching circuit is that instead of measuring the current through a small value sense resistor to detect a small difference in voltage thereacross, the present invention senses whether or not the linear loop is in regulation which is predetermined by setting the value of current through a current supply to a value that is representative of an open load condition. Hence, a more accurate determination of an open load condition can be determined.

Figure 2:
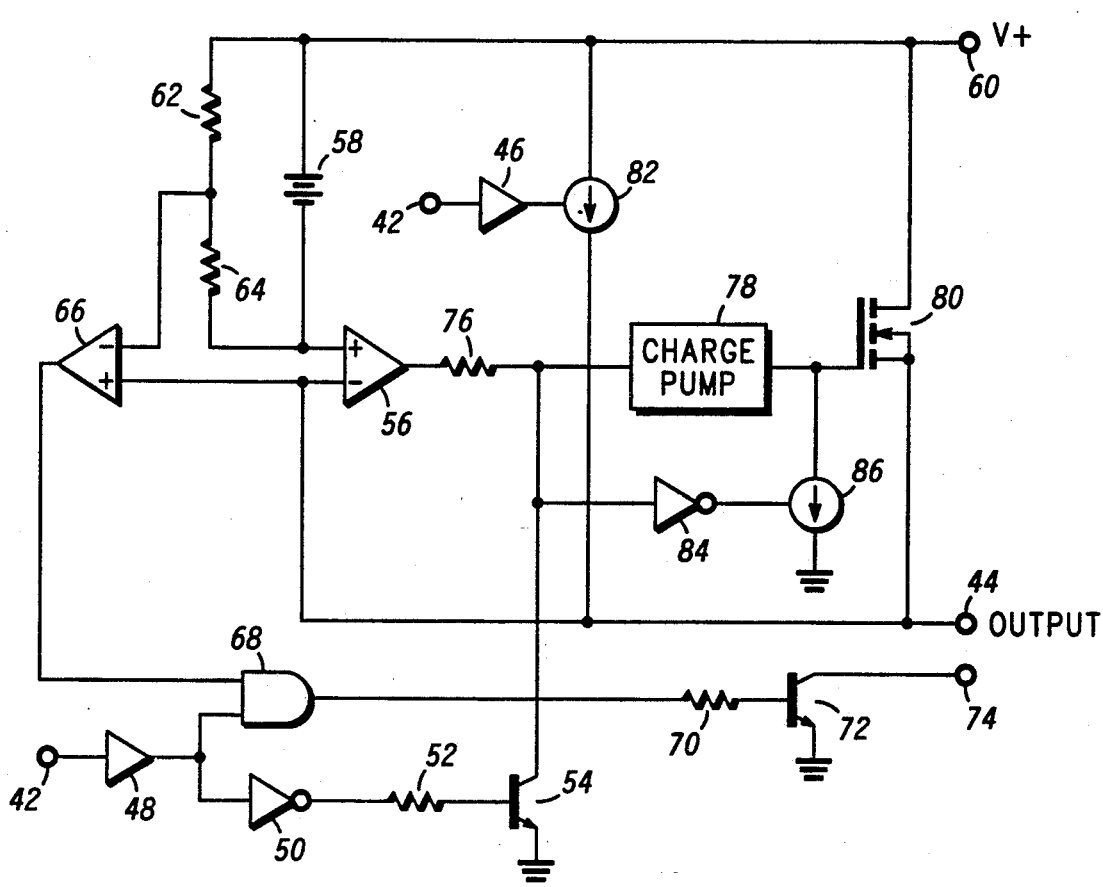
FIG. 2 is a partial schematic and block diagram illustrating an embodiment of the present invention.

Turning now to FIG. 2 there is shown high side driver switching circuit 40 incorporating the linear regulating loop of the embodiment of the present invention. In response to a control signal applied at input 42 current is sourced to output 44 as power MOSFET 80 is rendered conductive. A load means is conventionally connected between output 44 and ground 48 through which the load current flows. Open load sensing is provided by circuit 40 as aforedescribed to supply an open load status signal at output 74. In normal operation the logic one control signal applied at input 42 is buffered and applied to the input of inverter 50 through amplifier 48. The signal is inverted such that a logic zero is applied to the base of transistor 54 via resistor 52. Hence, transistor 54 is turned off which enables the regulating loop comprising op amp 56. Therefore, with V+ applied at node 60, a reference potential is supplied via voltage source 58 to the non-inverting input of op amp 56 which is initially greater than the potential supplied at the inverting input thereof and the output of the op amp goes high and is level shifted through charge pump 78 to turn on transistor 80. Simultaneously, current supply 86 is turned off as a logic zero is supplied thereto by inverter 84. Load current is thus sourced through transistor 80 to the low resistance load means (not shown) coupled to output 44. Current supply 82, which is coupled to input 42 via buffer amplifier 46, is set to source a current the magnitude of which is at the value representative of an open load condition. In normal operation then the inverting input of comparator 66 will be at a higher potential than its non-inverting input and its output will be at a logic zero. The output of And gate 68 is therefore also at a logic zero which disables open load sense transistor 72 the latter of which has its base coupled via resistor 70 to the output of And gate 68.

Again, if the load should become open circuited for any reason during operation, the regulating loop will maintain output 44 at a regulated potential until such time as current supply 82 can no longer sustain sourcing the current it requires. At this point the voltage potential will rise toward V+ which causes the output of op amp 56 to change states thereby reducing the gate voltage supplied from charge pump 78. Transistor 80 tends to shut off while current supply 86 is enabled via inverter 84 as the output of op amp 56 goes to a low state. Simultaneously, the output of comparator 66 is forced to a high state as the non-inverting input potential begins to rise toward V+. This places logic ones at both inputs of And gate 68. The ouput of And gate 68 thus goes high to enable transistor 72. As transistor 72 is enabled an open load sense signal is supplied at output 74. Once again, under normal load conditions when the switch voltage across MOSFET 80 exceeds V58, switch 40 functions as a conventional switching circuit.

Figure 3:
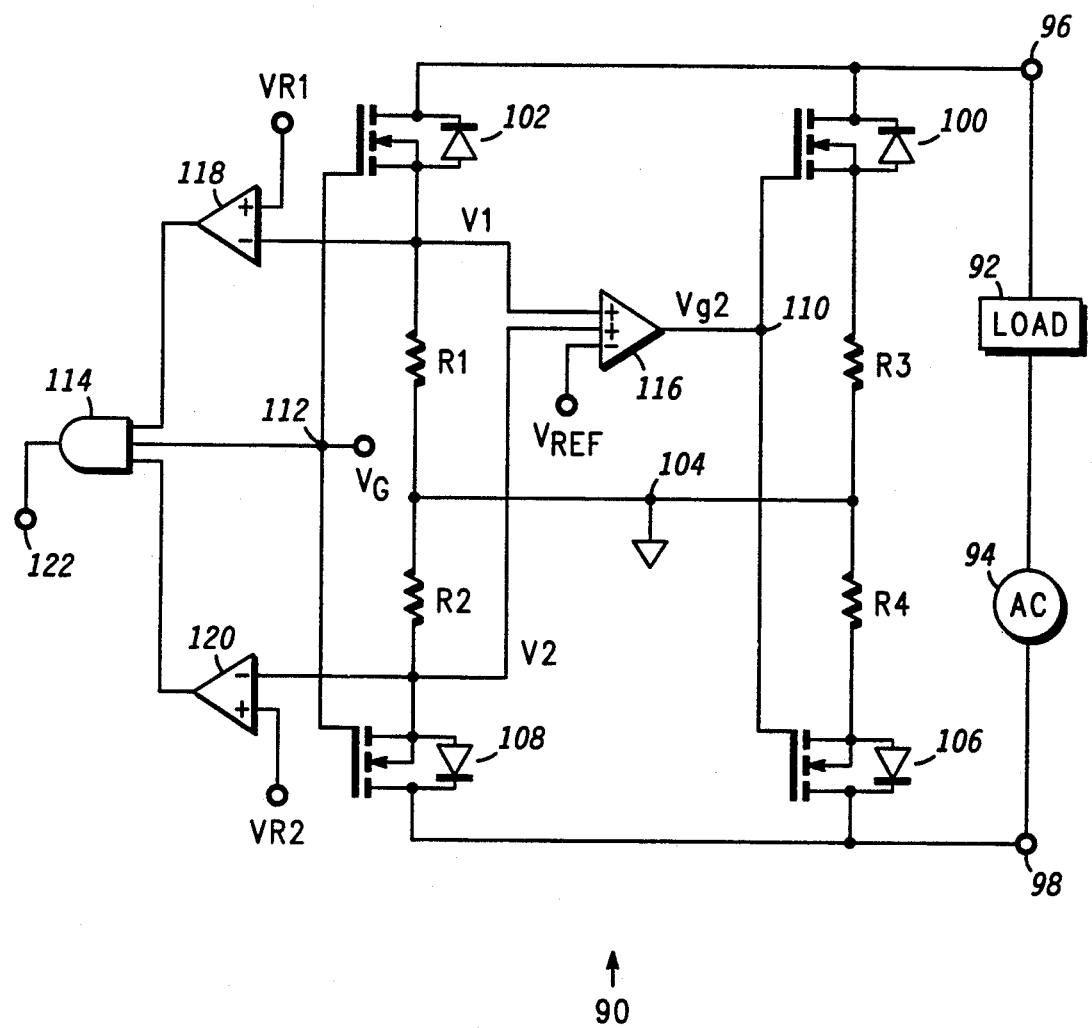
FIG. 3 is a partial schematic and block diagram of an additional embodiment of the present invention.

Referring to FIG. 3 there is shown alternating current (AC) switch circuit 90 of another embodiment of the invention. Circuit 90 is used to switch load 92 in a series conductive path with AC power supply source 94 during alternating cycles. With a positive input signal, Vg, applied at input 112, power MOSFET 100 will be turned on during the positive half-cycle of circuit operation to provide a load current path from power supply source 94 through load 92 and MOSFET 100, which is connected to load 92 at terminal 96, R3, R4 and through the body diode of MOSFET 106 to the other side of the power supply source. Similarly, during the negative half-cycle power MOSFET 106 is turned on to provide load current through load 92, power supply 94 and high current sense resistor R4 and R3 and through the body diode of MOSFET 100. Current sources are provided which are connected in parallel with respective power MOSFETs 100 and 106 in the same manner as previously discussed with respect to the foregoing embodiments of the present invention. The first current source comprises MOSFET 102 which has its main electrodes or drain and source electrodes coupled in series with resistor R1 across the drain of power MOSFET 100 and ground 104. Likewise, the second current source comprises MOSFET 108 having its drain and source electrodes series connected with resistor R2 across the drain of power MOSFET 106 and ground 104. MOSFETs 102 and 108 are much smaller devices than power MOSFETs 100 and 106. A regulating loop is provide by single comparator op amp 116 the output of which is coupled to the gates of power MOSFETs 100 and 106 respectively at node 110. The two non-inverting inputs of op amp 116 are coupled respectively to the series interconnection points between MOSFET 102 and resistor R1 and the MOSFET 108 and resistor R2 while the inverting input of op amp 116 is coupled to a reference voltage source $V_{REF}$.

Since the operation of the two mirror circuit portions of AC switch circuit 90 comprising MOSFETs 100 and 102 and MOSFETs 106 and 108 respectively are identical, occurring on alternating half-cycles of AC power supply source 94, for brevity only the operation during the positive half-cycle is described herein below. Hence, responsive to input signal, Vg, applied to input 112, MOSFET 102 is initially turned on to provide current through current source resistor R1 which also flows through R4 and the body diode of MOSFET 106 back to power supply source 94. This path of current flow occurs because the resistances of R3 and R4 are much less than those of resistors R1 and R2 respectively whereby the resistive conductive path consisting of R4 and the diode of MOSFET 106 is less than the resistive conductive path consisting of R2 and the diode of MOSFET 108. As R1 is a low resistance resistor, V1 will be less than $V_{REF}$ and the output of op amp 116 remains low which inhibits conduction of switching power MOSFET 100. However, once the current flow through MOSFET 102 and resistor R1 exceeds the value set for an open load condition, the voltage V1 exceeds $V_{REF}$ forcing the output of op amp 116 high such that Vg2 is sufficient to switch MOSFET 100, as well as MOSFET 106, into conduction. Load current thus flows through MOSFET 100 and sense resistor R3 to power supply source 94 through R4 and MOSFET 106. Op amp 116 will then linearly regulate the switch voltage at the drain of MOSFET 100 to enable maximum load current flow therethrough. In the regulated condition V1 exceeds VR1 and the output of comparator 118 is low which in turn forces the output of And gate 114 to be at a logic zero.

However, if during the normal operation condition described above load 92 should become open circuited the load current will begin to decrease. Once the load current decreases below the predetermined current set to flow through MOSFET 102 and resistor R1, V1 will become less than $V_{REF}$ and VR1. Op amp 116 can then no longer maintain the loop in regulation and the output of comparator 118 will go to a logic one level. Therefore, with all inputs to And gate 114 now being logic ones, the output of the gate goes to a logic one to signal an open load condition. During the negative half cycle, the current source comprising MOSFET 108 and sense resistor R2 are set to conduct in parallel with MOSFET 106 at a current value as aforedescribed with respect to MOSFET 102 and resistor R1 which enables op amp 116. The switch voltage at the drain of MOSFET 106 is thereby linearly regulated in the above manner. Not shown may be circuitry that blanks the output at terminal 122 during zero cross over of the alternating power supply source 94.

Thus, what has been described above are novel switching circuits for enabling load current through a load coupled that is operative connected in series with a power transistor. The switching voltage at the transistor is linear regulated to a predetermined value while a current source is coupled in parallel with the switched transistor the current value of which is set to a predetermined magnitude corresponding to a value representing an open load condition. By using a predetermined set current value that is indicative of an open load condition and which is independent of load current sensing provides an advantage over prior art switching circuits of the type discussed in that the independent current sensing provides more accurate sensing of the open load condition as opposed to comparing the voltage developed across the load sense resistor.

What is claimed is:

1. A circuit for operatively switching utilization means to a power supply source wherein the utilization means includes a controlled switching device series connected to load means such when the switching device is operative the load means is coupled to the power supply source, comprising:
   a current source responsive to an input signal applied to an input of the circuit for providing a current of a predetermined magnitude, said current source being coupled to the interconnection point between the switching device and the load means; and
   a regulating loop responsive to said input signal for both rendering the switching device operative and for regulating the potential at said interconnection point to a predetermined voltage when the current flowing through the load means exceeds the magnitude of said current provided by said current source and non-regulating said potential when said current through the load means is less than said current of said current source.

2. The circuit of claim 1 including said current source being coupled in parallel to said regulating loop; and circuit means responsive to the magnitude of said current flowing through the load means decreasing below said predetermined magnitude of said current of said current source during the presence of said input signal for providing an output signal indicating the same.

3. The circuit of claim 2 wherein:
   the switching device is a MOSFET having first and second electrodes and a control electrode, said first and second electrodes being in series connection with the load means; and
   said regulating loop includes a comparator operational amplifier which is enabled by said input signal and having inverting and non-inverting inputs and an output, said output being coupled to said control electrode of said MOSFET, said inverting input being coupled to a reference voltage and said non-inverting input being coupled to said interconnection point between the switching device and the load means.

4. A switching circuit for operatively connecting and disconnecting a load to a power supply source, comprising:
   switching means series connected to the load for electrically connecting the load to the power supply source when rendered operative to produce current flow through the load;
   a current source responsive to an input signal for providing a current of a predetermined magnitude when the current flowing through the load exceeds said predetermined magnitude as the load is electrically connected to the power supply source, said current source being coupled to the interconnection between said switching means and the load; and
   a linear regulating loop responsive to said input signal for both rendering said switching means operative and for regulating the magnitude of voltage developed at said interconnection between said switching means and the load to a predetermined value when the load current exceeds said current of said current source.

5. The circuit of claim 4 wherein said regulating loop is out of regulation as said load current becomes less than said current of said current source and said current source current can no longer be sustained to render said switching means non-operative.

6. The circuit of claim 5 wherein said switching means includes a transistor having first and second electrodes and a control electrode, said first and second electrodes being coupled
   in parallel to said current source and in series with the load; and said regulating loop includes an operational amplifier which is enabled by said input signal and having an output coupled to said control electrode of said transistor and first and second inputs, said first input being coupled to said interconnection between said switching means and the load and said second input being coupled to a first reference voltage.

7. The circuit of claim 6 wherein said transistor is a power MOSFET having a drain, source and gate being said first, second and control electrodes respectively, said drain being connected to said load, said gate being coupled to the output of said operational amplifier; and a first resistor coupled between said source and circuit ground reference.

8. The circuit of claim 7 including circuit means responsive to said load current becoming less than said current of said current source for providing an output signal indicative of the same.

9. The circuit of claim 8 including:
   a MOSFET having drain, source and gate electrodes, said drain electrode being coupled to said drain of said power MOSFET, said source electrode being coupled to said first input of said operational amplifier and said gate electrode being coupled to a terminal to which said input signal is applied; and
   a second resistor coupled between said source electrode of said MOSFET and circuit ground reference.

10. The circuit of claim 9 wherein said current source includes:
    an additional power MOSFET having a drain, source and gate, said drain being coupled to the power supply source the latter being an AC voltage supply, said gate being coupled to said output of said operational amplifier; and
    a third resistor coupled between circuit ground reference and said source of said additional power MOSFET.

11. The circuit of claim 10 including:
    an additional MOSFET having drain, source and gate electrodes, said drain electrode being coupled to said drain of said additional power MOSFET, said gate being coupled to said terminal to which said input signal is applied;
    a fourth resistor coupled between said source electrode of said additional MOSFET and said circuit ground reference, wherein said second and fourth resistors respectively correspond to said current source; and
    said operational amplifier having a third input coupled to said source electrode of said additional MOSFET.

12. The circuit of claim 11 wherein said circuit means includes:
    a first comparator having first and second inputs and an output, said first input being coupled to a second reference voltage, said second input being coupled to said source electrode of said MOSFET;
    a second comparator having first and second inputs and an output, said first input being coupled to a third reference voltage, said second input being coupled to said source electrode of said additional MOSFET; and
    a logic gate having a first, second and third inputs respectively coupled to said outputs of said first and second comparators and said terminal to which said input signal is applied, and having an output at which said output signal is produced.

13. The circuit of claim 6 including circuit means responsive to said load current becoming less than said current of said current source for providing an output signal indicative of the same.

14. The circuit of claim 13 wherein said transistor is a power MOSFET having a drain, source and gate corresponding to said first, second and control electrodes respectively, said drain being coupled to the power supply source, said source being coupled to an output terminal to which the load is connected; and said current source being coupled between said drain and source of said power MOSFET.

15. The circuit of claim 14 wherein said circuit means includes:
    a resistive divider coupled between said second input of said operational amplifier and said power supply source;
    a comparator having first and second inputs and an output, said first input being coupled to said first input of said operational amplifier, said second input being coupled to said resistive divider; and
    a logic gate having first and second inputs and an output, said first input being coupled to said output of said comparator, said second input receiving said input signal and said output being coupled to said output of the circuit.

16. A method for sensing the open load status of a load driven by a switching circuit the latter of which includes a transistor the main electrodes of which are series connected to the load and which electrically couples the load to a power supply when switched to a conducting state to provide load current through the load, comprising the steps of:
    rendering the transistor conducting responsive to an input signal being applied to the circuit;
    regulating the voltage at the series connection between the transistor and the load when the load current exceeds a predetermined magnitude while fully rendering the transistor conductive when the voltage developed at the series interconnection between the transistor and the load exceeds the value of the regulated voltage; and
    supplying a predetermined current having said predetermined magnitude which is indicative of the load being open.

* * * * *